United States Patent
Igarashi et al.

(10) Patent No.: US 9,537,325 B2
(45) Date of Patent: Jan. 3, 2017

(54) BATTERY STATE ESTIMATION SYSTEM, BATTERY CONTROL SYSTEM, BATTERY SYSTEM, AND BATTERY STATE ESTIMATION METHOD

(71) Applicant: Hitachi Vehicle Energy, Ltd., Hitachinaka-shi, Ibaraki (JP)

(72) Inventors: Naoyuki Igarashi, Hitachinaka (JP); Keiichiro Ohkawa, Hitachinaka (JP)

(73) Assignee: HITACHI AUTOMOTIVE SYSTEMS, LTD., Ibaraki (JP)

( * ) Notice: Subject to any disclaimer, the term of this patent is extended or adjusted under 35 U.S.C. 154(b) by 121 days.

(21) Appl. No.: 13/970,128

(22) Filed: Aug. 19, 2013

(65) Prior Publication Data

US 2014/0055100 A1 Feb. 27, 2014

(30) Foreign Application Priority Data

Aug. 24, 2012 (JP) ................. 2012-185453

(51) Int. Cl.
 *G01R 31/00* (2006.01)
 *H02J 7/00* (2006.01)
 *G01R 31/36* (2006.01)

(52) U.S. Cl.
 CPC ............ *H02J 7/00* (2013.01); *G01R 31/3624* (2013.01); *G01R 31/3651* (2013.01); *G01R 31/361* (2013.01); *G01R 31/3662* (2013.01); *G01R 31/3675* (2013.01)

(58) Field of Classification Search
 None
 See application file for complete search history.

(56) References Cited

U.S. PATENT DOCUMENTS

| | | | | |
|---|---|---|---|---|
| 6,777,914 B2* | 8/2004 | Ullrich et al. | ............... | 320/132 |
| 7,098,665 B2* | 8/2006 | Laig-Hoerstebrock | | G01R 31/3668 324/430 |
| 7,136,762 B2* | 11/2006 | Ono | ................. | G01R 31/361 320/132 |
| 7,295,014 B2* | 11/2007 | Koch et al. | ................. | 324/432 |
| 7,406,389 B2* | 7/2008 | Emori | ................. | B60W 10/26 702/183 |
| 7,498,772 B2* | 3/2009 | Palladino | ................. | 320/132 |
| 7,622,894 B2* | 11/2009 | Kawahara et al. | ........... | 320/127 |

(Continued)

FOREIGN PATENT DOCUMENTS

JP 2011-085592 A 4/2011

*Primary Examiner* — Leigh Garbowski

(74) *Attorney, Agent, or Firm* — Volpe and Koenig, P.C.

(57) ABSTRACT

A battery state estimation system estimates a state of charge of a chargeable battery. A SOCv computing unit calculates a state of charge of the battery using a voltage applied across the battery. A SOCi computing unit integrates a current flowing through the battery to calculate a state of charge of the battery. A SOCw computing unit which performs weighted addition to the state of charge of the battery calculated by the SOCv computing unit and the state of charge of the battery calculated by the SOCi computing unit, wherein when the temperature of the battery is a threshold value or less and the current flowing through the battery is a threshold value or less, the SOCw computing unit sets the specific gravity at the state of charge of the battery calculated by the SOCi computing unit larger than that in other cases upon the weighted addition.

9 Claims, 4 Drawing Sheets

(56) References Cited

U.S. PATENT DOCUMENTS

| | | | |
|---|---|---|---|
| 7,652,448 B2* | 1/2010 | Palladino | 320/104 |
| 8,466,708 B2* | 6/2013 | Kawahara | G01R 31/361 |
| | | | 320/132 |
| 2006/0076929 A1* | 4/2006 | Tatsumi et al. | 320/132 |
| 2010/0244846 A1* | 9/2010 | Desprez | G01R 31/3679 |
| | | | 324/427 |
| 2010/0244886 A1* | 9/2010 | Kawahara | G01R 31/361 |
| | | | 324/764.01 |
| 2012/0035873 A1* | 2/2012 | Kang | G01R 31/3648 |
| | | | 702/63 |
| 2012/0166116 A1* | 6/2012 | Yoshida | G01R 31/3624 |
| | | | 702/63 |
| 2013/0096763 A1* | 4/2013 | Izumi | B60R 16/03 |
| | | | 701/22 |
| 2014/0167656 A1* | 6/2014 | Yamada | G01R 31/3624 |
| | | | 318/139 |

* cited by examiner

| | BATTERY TEMPERATURE T | | | | | |
|---|---|---|---|---|---|---|
| BATTERY CURRENT I | -40°C | -30°C | -20°C | -10°C | 0°C | 10°C |
| -10A | 1 | 1 | 1 | 1 | 1 | 1 |
| 0A | 100 | 100 | 100 | 50 | 50 | 1 |
| 10A | 1 | 1 | 1 | 1 | 1 | 1 |

BATTERY STATE ESTIMATION SYSTEM, BATTERY CONTROL SYSTEM, BATTERY SYSTEM, AND BATTERY STATE ESTIMATION METHOD

BACKGROUND OF THE INVENTION

1. Field of the Invention

The present invention relates to a technology which estimates a state of charge of a battery.

2. Description of the Related Art

In devices each using storing devices such as a lithium secondary battery, a nickel-metal hydride battery, a lead battery, an electric double-layer capacitor, etc., e.g., a battery system, a distributed power storage system and an electric vehicle, a state detection device for detecting the state of the storing device has been employed to use the storing device with safety and effectively. As the state of the storing device, there are mentioned a state of charge (SOC) indicative of the extent to which it is being charged, or how dischargeable amount of charge remains, a state of health (SOH) indicative of how it is deteriorated, etc.

An SOC for a portable device and in a battery system of an electric vehicle or the like can be detected by integrating a discharge current from full charge and calculating the ratio of the amount of charge (remaining capacity) remaining in a storing device to the amount of charge (full capacity) chargeable to the maximum. In addition, the relation between a voltage (open circuit voltage) applied across a battery and the remaining capacity of battery is defined in a data table or the like in advance, and the current remaining capacity can also be calculated by referring to the data table or the like. Further, the state of charge can also be determined by using these techniques in combination.

A method of performing weighted addition to a charge characteristic determined from a discharge current and a charge characteristic determined from a battery voltage and deciding a weight at this time, based on a current value obtained from the output of a storing device and an internal resistance, thereby determining a state of charge has been described in JP-2011-85592-A.

SUMMARY OF THE INVENTION

The technology described in JP-2011-85592-A encounters a difficulty in coping with a change in the charge characteristic due to a change in temperature because the current of the storing device and its internal resistance cause the weight to change. For example, when a battery temperature is low, the internal resistance may greatly change depending on a battery current, and therefore the accuracy of calculation of the charge characteristic determined from the battery voltage is apt to deteriorate. Particularly when the battery temperature is low and the battery current is small, there is a noticeable tendency that an operational result becomes unstable.

The present invention has been made in view of the above problems. It is an object of the present invention to estimate a state of charge of a battery with satisfactory accuracy in response to a change in charge characteristic due to a battery temperature, particularly, a change in charge characteristic at a low temperature.

A battery state estimation system according to the present invention performs weighted addition to a state of charge calculated based on a battery voltage and a state of charge calculated by integrating a battery current and increases the specific gravity at the state of charge calculated by integrating the battery current when a battery temperature is a predetermined temperature threshold value or less and the battery current is a predetermined current threshold value or less.

According to the battery state estimation system of the present invention, a state of charge of a battery can be estimated with satisfactory accuracy even when a battery temperature is low and a battery current is small.

BRIEF DESCRIPTION OF DRAWINGS

These and other features, objects and advantages of the present invention will become more apparent from the following description when taken in conjunction with the accompanying drawings wherein.

DESCRIPTION OF THE PREFERRED EMBODIMENTS

First Embodiment

System Configuration

Figure 1:
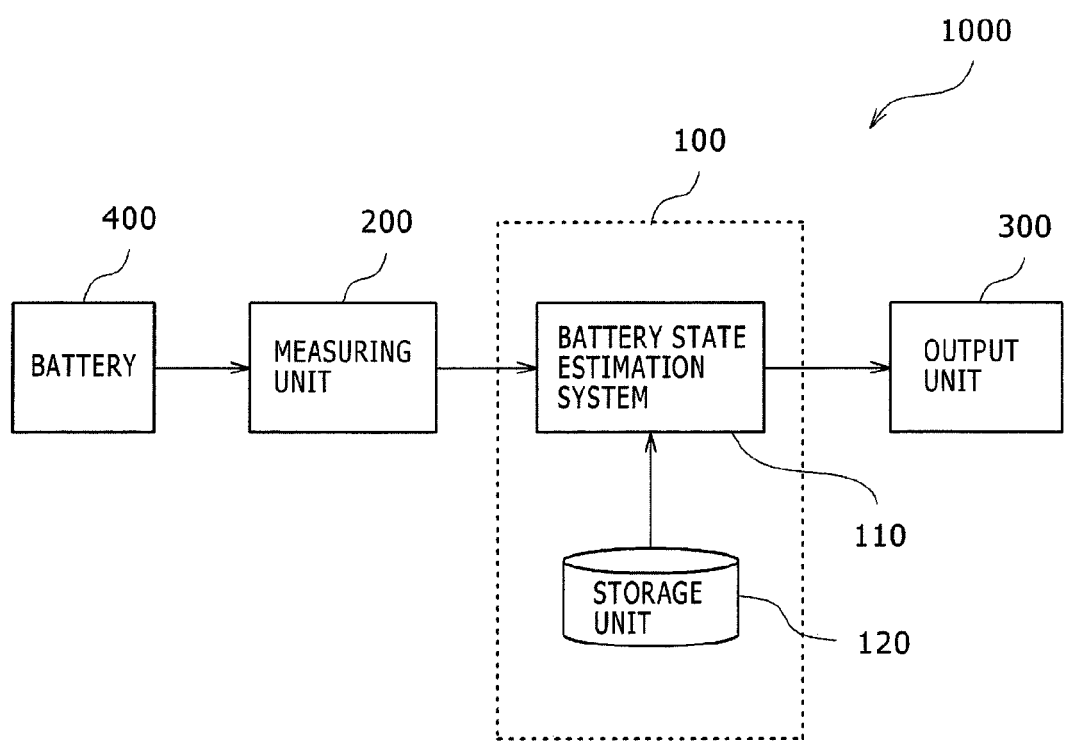
FIG. 1 is a block diagram showing a configuration of a battery system according to a first embodiment.

FIG. 1 is a block diagram showing a configuration of a battery system 1000 according to a first embodiment of the present invention. The battery system 1000 is a system which supplies an electrical charge accumulated in a battery 400 to an external device as power. The battery system 1000 is equipped with a battery control system 100, a measuring unit 200 and an output unit 300. As targets for the supply of power from the battery system 1000, there are considered, for example, an electric vehicle, a hybrid vehicle, an electric train, etc.

The battery 400 is a chargeable battery such as a lithium-ion secondary battery or the like. In addition to it, the present invention can be applied even to devices each having a power storage function, such as a nickel-metal hydride battery, a lead battery, an electric double-layer capacitor, etc. The battery 400 may be formed by single-battery cells or may be a module structure in which single cells are combined in plural form.

The measuring unit 200 is a functional unit which measures physical properties of the battery 400 such as a voltage V applied across the battery 400, a current I flowing through the battery 400, a temperature T of the battery 400, an internal resistance R of the battery 400, etc. The measuring unit 200 comprises a sensor that measures each value, a necessary electric circuit and the like. As to the internal resistance R, a battery state estimation system 110 to be described later may indirectly measure it using other measurement parameters. In the present embodiment, the latter is taken as a premise. That is, the battery state estimation system 110 itself corresponds to the "resistance measuring unit" in the present embodiment.

The output unit 300 is a functional unit which outputs the output of the battery control system 100 to an external device (e.g., a host device such as a vehicle control device included in an electric vehicle).

The battery control system 100 is a system for controlling the operation of the battery 400 and is equipped with the battery state estimation system 110 and a storage unit 120.

The battery state estimation system 110 calculates an SOC of the battery 400, based on the respective values (voltage V applied thereacross, battery current I and battery temperature T) measured by the measuring unit 200, and the property information (polarization voltage Vp, internal resistance R and the like to be described in detail later) of the battery 400, which have been stored in the storage unit 120. The details of its calculation method will be explained later.

The storage unit 120 has stored therein the pre-knowable property information of the battery 400, such as the internal resistance R, polarization voltage Vp, charging efficiency, allowable current, full capacity and the like of the battery 400. As to the information, their values may individually be stored according to the operation of charge/discharge. Alternatively, as to the state of charge, the temperature and the like, their values may individually be stored for every state of the battery 400, or one value common to all states of the battery 400 may be stored. Further, the storage unit 120 has stored therein an association table to be explained in FIG. 6 to be described later.

The battery control system 100 and the battery state estimation system 110 may be configured using hardware such as a circuit device or the like for implementing their functions or may be configured by allowing an arithmetic unit such as a CPU to execute software with their functions implemented therein. In the latter case, the software can be stored in the storage unit 120, for example.

The storage unit 120 is configured using a storage device such as a flash memory, an EEPROM (Electrically Erasable Programmable Read Only Memory), a magnetic disk or the like. The storage unit 120 may be provided outside the battery state estimation system 110 or may be realized as a memory device provided inside the battery state estimation system 110. The storage unit 120 may detachably be provided. When it is detachably set, the property information and software can simply be changed by replacing the storage unit 120. Providing a plurality of storage units 120 and storing property information and software in the replaceable storage units 120 in a distributed manner enable the property information and the software to be updated for every small unit.

Figure 2:
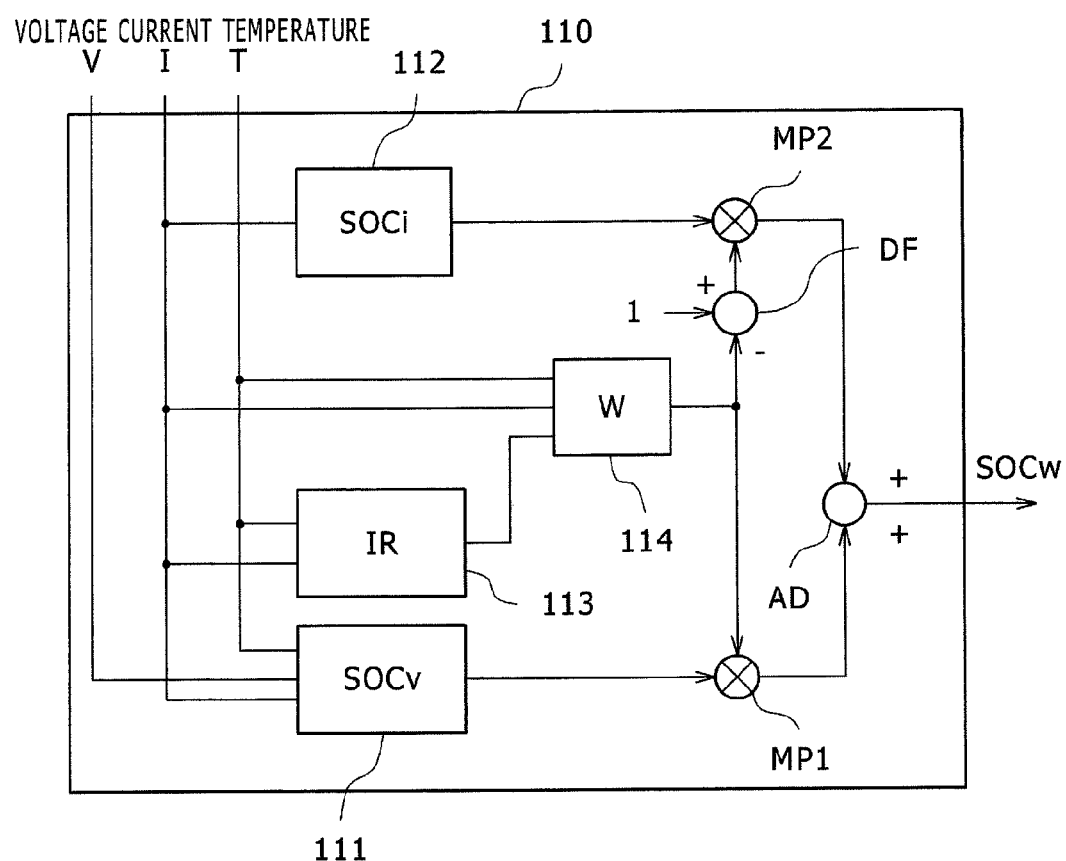
FIG. 2 is a functional block diagram illustrating the details of a battery state estimation system.

FIG. 2 is a functional block diagram showing the details of the battery state estimation system 110. The battery state estimation system 110 is provided with an SOCv computing unit 111, an SOCi computing unit 112, an IR computing unit 113, and a weight computing unit 114. The battery state estimation system 110 outputs a state of charge SOCw corresponding to a result of estimation of a state of charge of the battery 400. Other computing units will be described later.

The SOCv computing unit 111 calculates the SOC of the battery 400 using the voltage V applied across the battery 400, which has been measured by the measuring unit 200. This will hereinafter be referred to as SOCv. The SOCi computing unit 112 integrates the battery current I of the battery 400 measured by the measuring unit 200 to thereby calculate the SOC of the battery 400. This is hereinafter referred to as SOCi. A method of calculating the SOCv and SOCi will be explained later. The IR computing unit 113 multiplies the battery current I and the internal resistance R by each other. A method of determining the internal resistance R will be described later. The weight computing unit 114 calculates a weight W for performing weighted addition of the SOCv and the SOCi. A method of calculating W will be described later.

The multiplier MP1 multiplies the SOCv and the weight W by each other to determine W×SOCv. The subtracter DF determines (1−W). The multiplier MP2 multiplies the SOCi and (1−W) by each other to determine (1−W)×SOCi. The adder AD adds these together to determine SOCw. That is, the SOCw is represented by the following equation (1):

$$SOCw = W \times SOCv + (1-W) \times SOCi \quad (1)$$

First Embodiment

Operation of SOCv Computing Unit 111

Figure 3:
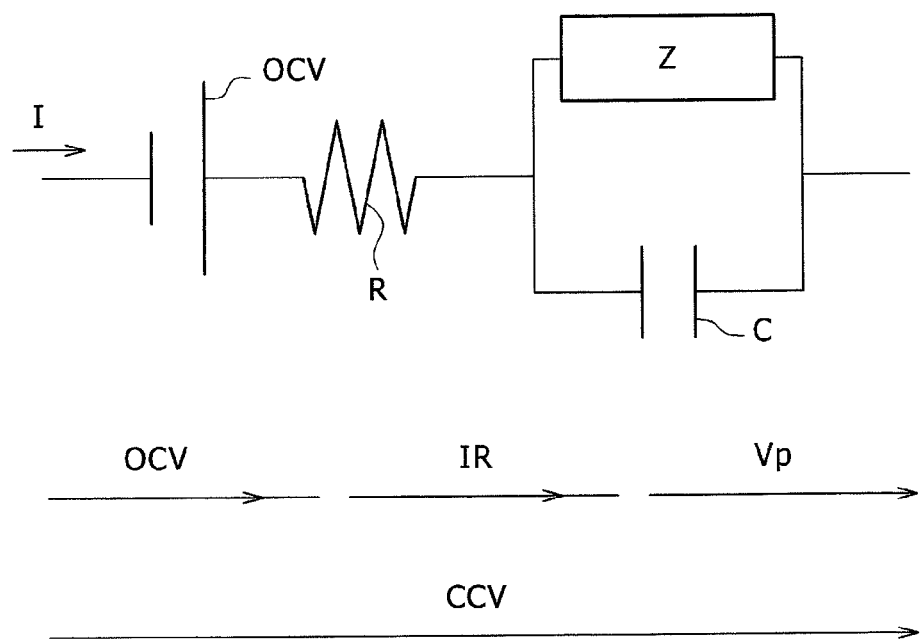
FIG. 3 is an equivalent circuit diagram of a battery.

FIG. 3 is an equivalent circuit diagram of the battery 400. The battery 400 can be represented by a pair of an impedance Z and a capacitance component C connected in parallel, and a series connection of an internal resistance R and an open circuit voltage OCV. When a battery current I is applied to the battery 400, the terminal-to-terminal voltage (closed circuit voltage: CCV) of the battery 400 is represented by the following equation (2). Vp is a polarization voltage and equivalent to a voltage applied across the pair of the impedance Z and capacitance component C connected in parallel.

$$CCV = OCV + I \cdot R + Vp \quad (2)$$

The open circuit voltage OCV is used to determine the SOC as will be described later, but cannot be directly measured while the battery 400 is being charged and discharged. Thus, the SOCv computing unit 111 subtracts the IR drop and the polarization voltage Vp from the closed circuit voltage CCV in accordance with the following equation (3) to determine the open circuit voltage OCV.

$$OCV = CCV - IR - Vp \quad (3)$$

The internal resistance R and the polarization voltage Vp can be stored in the storage unit 120 in advance as property information. Since the internal resistance R and the polarization voltage Vp differ according to the state of charge of the battery 400, the temperature thereof and the like, the individual values can be stored in the storage unit 120 for every combination of these. Property information in which the correlation between the internal resistance R and the battery temperature T is defined, is equivalent to a "resistance table" in the present embodiment.

Figure 4:
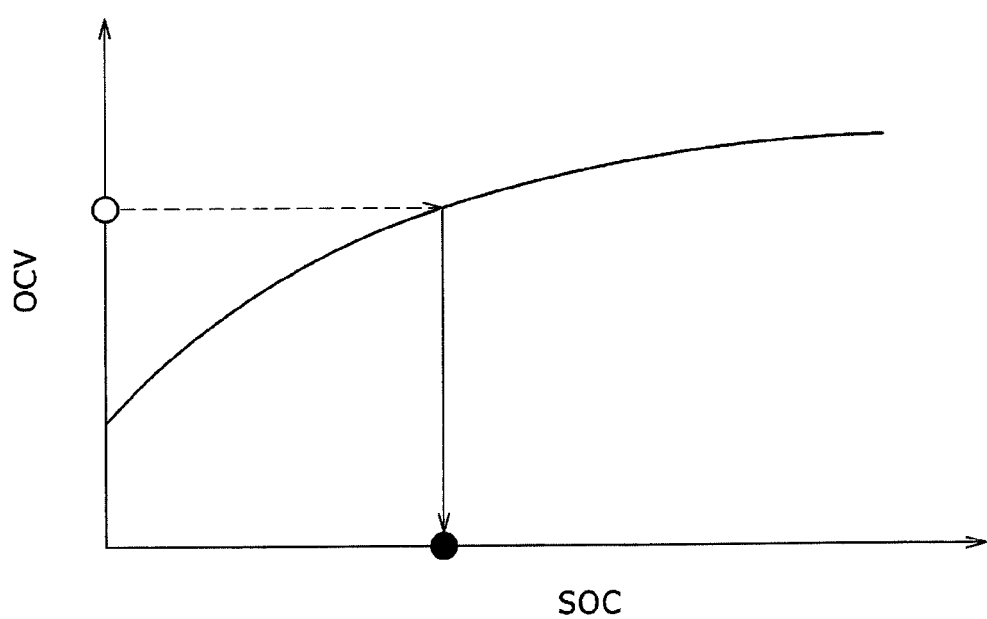
FIG. 4 is a diagram showing the relationship between an open circuit voltage OCV of the battery and a state of charge SOC thereof.

FIG. 4 is a diagram showing the relationship between the open circuit voltage OCV of the battery 400 and its SOC. Since this correlation is defined by the properties of the battery 400, data that defines the correlation can be stored in the storage unit 120 in advance. The data is equivalent to an "SOC table" in the present embodiment. The SOCv computing unit 111 calculates the open circuit voltage OCV using the above equation (3) and refers to the SOC table with the open circuit voltage as a key, thereby being able to calculate the SOCv of the battery 400.

First Embodiment

Operation of SOCi Computing Unit 112

The SOCi computing unit 112 integrates the charging/discharging battery current I of the battery 400 to thereby determine the SOCi of the battery 400. Qmax is the full charge capacity of the battery 400 and can be stored in the storage unit 120 in advance. SOCold is the latest calculated value of SOC.

$$SOCi = SOCold + 100 \times \int I / Qmax \qquad (4)$$

First Embodiment

Operation of Weight Computing Unit 114

Figures 5, 6:
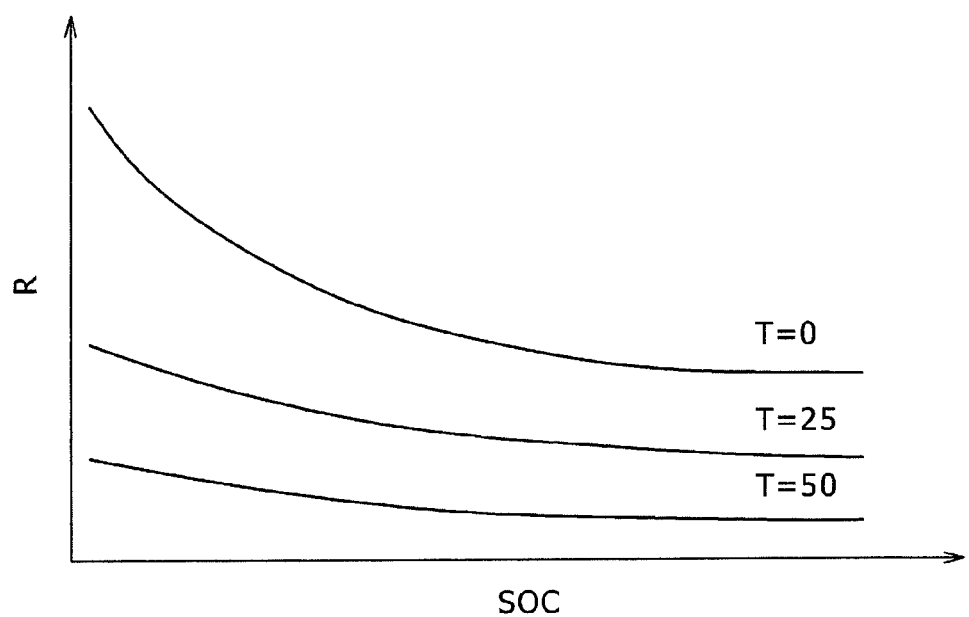
FIG. 5 is a diagram depicting the manner in which the internal resistance of the battery changes depending on a battery temperature.
FIG. 6 is a diagram illustrating a data example of an association table stored in a storage unit.

FIG. 5 is a diagram showing the manner in which the internal resistance R of the battery 400 changes depending on the battery temperature T. As shown in FIG. 5, in general, the internal resistance R of the battery 400 is high in a low SOC state, and the value of the internal resistance R thereof is large in a low temperature state. Thus, at this time, it is considered to be desirable that SOCi is used without using SOCv susceptible to an error in the internal resistance R. It is considered to be desirable that SOCv is used without using SOCi because it is affected by a slight measurement error of a current sensor when the battery current I is small.

Based on the above, the weight computing unit 114 determines a weight W in such a manner that SOCw is calculated using SOCv principally when the battery current I is small and SOCw is calculated using SOCi principally when the battery current I is large. Likewise, the weight computing unit 114 determines a weight W in such a manner that when the internal resistance R is small, SOCw is calculated using SOCv principally and when the internal resistance R is large, SOCw is calculated using SOCi principally. That is, the weight W related to SOCv is set large as the battery current I becomes smaller, and the weight W related to SOCv is set large as the internal resistance R becomes smaller. The weight W can be calculated in accordance with the following equation (5), for example:

$$W = 1/(1 + R \cdot I) \qquad (5)$$

According to the above method, since W becomes small in the case of the low SOC, low temperature, degradation and large current, the specific gravity at SOCi becomes large. Since W becomes large in the case of the high SOC, high temperature and small current, the specific gravity at SOCv becomes large.

First Embodiment

Correction of Weight W

It has been found out by the present inventors of the present application that although the weight computing unit 114 determines the weight W as described above in principle, it is necessary to correct the weight W due to the following reasons when the battery temperature T is low and the battery current I is small.

As the battery temperature T becomes lower, the internal resistance R may greatly change depending on the battery current I flowing at that time. In particular, the present inventors of the present application have found out that there is a noticeable trend that when the battery current I is small and the battery temperature T is low, the internal resistance R changes greatly and does not coincide with the predetermined correlation between the internal resistance R and the battery temperature T.

Since the weight W becomes large according to the above equation (5) when the battery current I is small, the specific gravity at SOCv is set large in principle. Since, however, the value of the internal resistance R becomes extremely inaccurate as described above where the battery current I is small and the battery temperature T is low, SOCv susceptible to an error in the internal resistance R should not be used. Thus, in this case, the weight W is corrected in such a manner that SOCi is mainly used.

FIG. 6 is a diagram showing a data example of the association table stored in the storage unit 120. The association table is a data table in which the correlation of coefficients Wgain used to correct the battery temperature T, battery current I and weight W is defined. The weight computing unit 114 refers to the association table using the battery temperature T and current I acquired from the measuring unit 200 to thereby obtain the coefficient Wgain and correct the weight W in accordance with the following equation (6):

$$W = 1/(1 + R \cdot I)/Wgain \qquad (6)$$

According to the above equation (6) and the data example shown in FIG. 6, since the value of Wgain is large as the battery temperature T becomes lower and the battery current I becomes smaller, the weight W becomes small. That is, when the battery temperature T is a predetermined threshold value or less and the battery current I is a predetermined threshold value or less, the weight W is multiplied by 1/Wgain corresponding to a coefficient less than 1 to reduce the weight W, thus making it possible to increase the specific gravity at SOCi.

Since the values of Wgain to be defined in the association table differ depending on the properties of the battery 400, the properties of the battery 400 are preferably examined in advance to determine suitable threshold values. Although the battery temperature T is defined at 10° C. intervals and the battery current I is defined at 10 A intervals in FIG. 6, the intervals to be defined may be defined as appropriate according to the properties of the battery 400 and the like in like manner.

First Embodiment

Summary

In the battery state estimation system 110 according to the first embodiment as described above, when the battery temperature T is lower than the predetermined threshold value, and the battery current I is smaller than the predetermined threshold value, the weight W is corrected in such a manner that the specific gravity at SOCi becomes large. It is thus possible to minimize the influence of error expansion due to the internal resistance R, which is difficult to predict under conditions of the low temperature and the small current and estimate SOC with satisfactory accuracy.

Second Embodiment

Although the first embodiment has described that the coefficient Wgain is defined according to the association table shown in FIG. 6, the value of Wgain corresponding to the battery temperature T or the battery current I undefined in the association table can be determined by performing interpolation operations such as linear interpolation, etc. by the weight computing unit 114.

For example, when the battery temperature T=5° C. and the battery current I=0 A, the coefficient Wgain can be set to Wgain=25.5 by taking the middle between Wgain=50 at T=0° C. and Wgain=1 at T=10° C. Likewise, when the battery temperature T=−40° C. and the battery current I=5 A, the coefficient Wgain can be set to 50.5 by taking the middle between Wgain=1 at I=−10 A and Wgain=100 at I=0 A.

While we have shown and described several embodiments in accordance with our invention, it should be understood that disclosed embodiments are susceptible of changes and modifications without departing from the scope of the invention. Therefore, we do not intend to be bound by the details shown and described herein but intend to cover all such changes and modifications within the ambit of the appended claims.

What is claimed is:

1. A battery state estimation system comprising:
a temperature measuring unit which measures a temperature of the battery;
a current measuring unit which measures a current flowing through the battery;
a voltage measuring unit which measures a voltage applied across the battery;
a resistance measuring unit which measures an internal resistance of the battery;
an $SOC_v$ computing unit configured to determine an $SOC_v$ value based on a state of charge of a battery using the voltage applied across the battery;
an $SOC_i$ computing unit configured to determine an $SOC_i$ value based on the current flowing through the battery to calculate a state of charge of the battery;
a weight computing unit that is configured to:
compare the temperature of the battery to a temperature threshold value;
compare the current flowing through the battery to a current threshold value;
determine a weighting factor (W), based on the internal resistance of the battery and the current flowing through the battery but not the temperature of the battery, when at least one of the following is determined based on the comparisons: the temperature of the battery is greater than a temperature threshold value, or the current flowing through the battery is greater than the current threshold value;
determine W, based on the internal resistance of the battery, the current flowing through the battery, and the temperature of the battery, when the temperature of the battery is determined, based on the comparison, to be less than or equal to the temperature threshold value and the current flowing through the battery is determined, based on the comparison, to be less than or equal to the current threshold value, wherein determining W includes:
identifying a value Wgain based on the temperature of the battery and the current flowing through the battery, and
determining W based on the value Wgain; and
a $SOC_w$ computing unit that is configured to:
calculate a state of charge $SOC_w$ value according to Equation 1, Equation 1: $SOC_w = W \ast SOC_v + (1-W) \ast SOC_i$.

2. The battery state estimation system according to claim 1, wherein when the temperature of the battery is less than or equal to the temperature threshold value and the current flowing through the battery is less than or equal to the current threshold value, W is determined to be less than 1.

3. The battery state estimation system according to claim 2, further comprising:
a storage unit which stores therein an association table in which a correlation between the temperature of the battery, the current flowing through the battery and value Wgain are defined,
wherein the weight computing unit is further configured to determine W based on the association table.

4. The battery state estimation system according to claim 3, wherein the weight computing unit is further configured to determine W by linearly interpolating a correlation between the temperature and the value Wgain defined in the association table.

5. The battery state estimation system according to claim 3, wherein the weight computing unit is further configured to determine W by linearly interpolating a correlation between the current and the value Wgain defined in the association table.

6. The battery state estimation system according to claim 2, further comprising:
a resistance table including a correlation between the temperature of the battery and the internal resistance of the battery,
wherein the resistance measuring unit measures the internal resistance of the battery based on the resistance table with the temperature of the battery as a key.

7. The battery state estimation system according to claim 1, further comprising:
an SOC table that includes a correlation between an open circuit voltage of the battery and a state of charge of the battery,
wherein the $SOC_v$ computing unit is further configured to calculate the state of charge of the battery based on the SOC table with the open circuit voltage of the battery as a key.

8. The battery state estimation system according to claim 1, wherein when the temperature of the battery is less than or equal to the temperature threshold value and the current flowing through the battery is less than or equal to the current threshold value, the weight computing unit sets a weight factor used by the $SOC_i$ computing unit to determine the state of charge of the battery higher than in instances in which one or more of the temperature threshold value or the current threshold value are exceeded.

9. A method of estimating a state of charge of a chargeable battery, comprising:
measuring a temperature of the battery;
measuring a current flowing through the battery;
determining an $SOC_v$ value based on a voltage applied across the battery;
determining an $SOC_i$ value based on the current flowing through the battery;
comparing the temperature of the battery to a temperature threshold value;
comparing the current flowing through the battery to a current threshold value; and
determining a weighting factor (W), based on an internal resistance of the battery and the current flowing through the battery, but not the temperature of the battery, when at least one of the following is determined based on the comparisons: the temperature of the battery is greater than a temperature threshold value, or the current flowing through the battery is greater than the current threshold value;
determining W, based on the internal resistance of the battery, the current flowing through the battery and the temperature of the battery, when the temperature of the battery is determined, based on the comparison, to be less than or equal to the temperature threshold value and the current flowing through the battery is determined, based on the comparison, to be less than or equal to the current threshold value, wherein determining W includes:
identifying a value Wgain based on the temperature of the battery and the current flowing through the battery, and
determining W based on the value Wgain; and
calculating an $SOC_w$ value accordingly to Equation 1, Equation 1: $SOC_w = W*SOC_v + (1-W)*SOC_i$.

* * * * *